US006879088B2

(12) United States Patent
Wong et al.

(10) Patent No.: US 6,879,088 B2
(45) Date of Patent: Apr. 12, 2005

(54) INSERTION-TYPE LIQUID METAL LATCHING RELAY ARRAY

(75) Inventors: Marvin Glenn Wong, Woodland Park, CO (US); Arthur Fong, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 172 days.

(21) Appl. No.: 10/412,880

(22) Filed: Apr. 14, 2003

(65) Prior Publication Data

US 2004/0201309 A1 Oct. 14, 2004

(51) Int. Cl.[7] ........................ H01L 41/08; H01H 29/02; H01H 57/00

(52) U.S. Cl. ......................... 310/328; 310/26; 200/188; 200/211; 200/214; 200/215; 335/47; 335/49; 335/58

(58) Field of Search ................................ 200/188, 211, 200/214, 215; 310/26, 328; 335/47, 49, 58

(56) References Cited

U.S. PATENT DOCUMENTS

| | | | | |
|---|---|---|---|---|
| 2,312,672 A | 3/1943 | Pollard, Jr. | .................. | 335/58 |
| 2,564,081 A | 8/1951 | Schilling | ..................... | 335/56 |
| 3,430,020 A | 2/1969 | Tomkewitsch et al. | ..... | 200/181 |

(Continued)

FOREIGN PATENT DOCUMENTS

| | | |
|---|---|---|
| EP | 0593836 A1 | 10/1992 |
| FR | 2418539 A | 9/1979 |
| FR | 2458138 A1 | 10/1980 |

(Continued)

OTHER PUBLICATIONS

Jonathan Simon, "A Liquid–Filled Microrelay With A Moving Mercury Microdrop" (Sep. 1997), Journal of Microelectromechinical Systems, vol. 6, No. 3. pp 208–216.

Marvin Glenn Wong, "A Piezoelectrically Actuated Liquid Metal Switch", May 2, 2002, patent application (pending, 12 pages of specification, 5 pages of claims, 1 page of abstract, and 10 sheets of drawings (Figs. 1–10).

Bhedwar, Homi C. et al., "Ceramic Multilayer Package Fabrication," Electronic Materials Handbook, Nov. 1989, pp. 460–469, vol. 1 Packaging, Section 4: Packages.

(Continued)

*Primary Examiner*—Thomas M. Dougherty

(57) ABSTRACT

An electrical relay array using conducting liquid in the switching mechanism. The relay array is amenable to manufacture by micro-machining techniques. Each element of the relay array uses an actuator, such as a piezoelectric element, to cause a switch actuator to insert into a cavity in a static switch contact structure. The cavity has sides and a pad on its end that are wettable by the conducting liquid. The cavity is filled with the conducting liquid, which may be liquid metal. Insertion of the switch actuator into the cavity causes the conducting liquid to be displaced outward and come in contact with the contact pad on the switch actuator. The volume of conducting liquid is chosen so that when the actuator returns to its rest position, the electrical contact is maintained by surface tension and by wetting of the contact pads on both the static switch contact structure and the actuator. When the switch actuator retracts away from the static switch contact structure, the available volume for conducting liquid inside the fixed switch contact structure increases and the combination of the movement of the conducting liquid into the cavity and the contact pad on the switch actuator moving away from the bulk of the conducting liquid causes the conducting liquid connection between the fixed and moving contact pads to be broken. When the switch actuator returns to its rest position, the contact remains electrically open because there is not enough conducting liquid to bridge the gap without being disturbed. The high frequency capability is provided by the additional conductors in the assembly, which act to make the switch a coaxial structure.

24 Claims, 8 Drawing Sheets

U.S. PATENT DOCUMENTS 3,529,268 A 9/1970 Rauterberg .................. 335/56
3,600,537 A 8/1971 Twyford ...................... 200/407
3,639,165 A 2/1972 Rairden, III ................ 428/433
3,657,647 A 4/1972 Beusman et al. ............. 324/94
4,103,135 A 7/1978 Gomez et al. .............. 200/185
4,200,779 A 4/1980 Zakurdaev et al. ......... 200/187
4,238,748 A 12/1980 Goullin et al. ................ 335/56
4,245,886 A 1/1981 Kolodzey et al. ............. 385/19
4,336,570 A 6/1982 Brower et al. ................. 362/4
4,419,650 A 12/1983 John .......................... 337/119
4,434,337 A 2/1984 Becker ....................... 200/220
4,475,033 A 10/1984 Willemsen et al. ...... 250/201.1
4,505,539 A 3/1985 Auracher et al. ............. 385/19
4,582,391 A 4/1986 Legrand ...................... 385/17
4,628,161 A 12/1986 Thackrey ................. 200/61.47
4,652,710 A 3/1987 Karnowsky et al. ........ 200/235
4,657,339 A 4/1987 Fick ........................... 385/22
4,742,263 A 5/1988 Harnden, Jr. et al. ....... 310/331
4,786,130 A 11/1988 Georgiou et al. ............. 385/48
4,797,519 A 1/1989 Elenbaas .................... 200/226
4,804,932 A 2/1989 Akanuma et al. ............. 335/38
4,988,157 A 1/1991 Jackel et al. .................. 385/17
5,278,012 A 1/1994 Yamanaka et al. ............ 430/30
5,415,026 A 5/1995 Ford ........................... 73/651
5,502,781 A 3/1996 Li et al. ........................ 385/4
5,644,676 A 7/1997 Blomberg et al. .......... 370/416
5,675,310 A 10/1997 Wojnarowski et al. ...... 338/309
5,677,823 A 10/1997 Smith ......................... 361/234
5,751,074 A 5/1998 Prior et al. ................. 307/118
5,751,552 A 5/1998 Scanlan et al. ............. 361/707
5,828,799 A 10/1998 Donald ........................ 385/16
5,841,686 A 11/1998 Chu et al. ..................... 365/51
5,849,623 A 12/1998 Wojnarowski et al. ...... 438/382
5,874,770 A 2/1999 Saia et al. .................. 257/536
5,875,531 A 3/1999 Nellissen et al. .......... 29/25.35
5,886,407 A 3/1999 Polese et al. ............... 257/706
5,889,325 A 3/1999 Uchida et al. .............. 257/724
5,912,606 A 6/1999 Nathanson et al. ........... 335/47
5,915,050 A 6/1999 Russell et al. ................. 385/7
5,972,737 A 10/1999 Polese et al. ............... 438/122
5,994,750 A 11/1999 Yagi ........................... 257/415
6,021,048 A 2/2000 Smith ......................... 361/736
6,180,873 B1 1/2001 Bitko ......................... 174/9 F
6,201,682 B1 3/2001 Mooij et al. ............. 361/306.1
6,207,234 B1 3/2001 Jiang .......................... 427/333
6,212,308 B1 4/2001 Donald ........................ 385/16
6,225,133 B1 5/2001 Yamamichi et al. ........... 438/3
6,278,541 B1 8/2001 Baker ......................... 359/291
6,304,450 B1 10/2001 Dibene, II et al. .......... 361/704
6,320,994 B1 11/2001 Donald et al. ................ 385/16
6,323,447 B1 11/2001 Kondoh et al.
6,351,579 B1 2/2002 Early et al. ................... 385/18
6,356,679 B1 3/2002 Kapany ....................... 385/18
6,373,356 B1 4/2002 Gutierrez et al.
6,396,012 B1 5/2002 Bloomfield ................. 200/233
6,396,371 B2 5/2002 Streeter et al. ............... 335/28
6,408,112 B1 6/2002 Bartels ........................ 385/16
6,446,317 B1 9/2002 Figueroa et al. ........... 29/25.42
6,453,086 B1 9/2002 Tarazona ..................... 385/20
6,470,106 B2 10/2002 McClelland et al. .......... 385/16
6,487,333 B2 11/2002 Fouquet et al. ............... 385/18
6,501,354 B1 12/2002 Gutierrez et al. ............. 335/47
6,512,322 B1 1/2003 Fong et al.
6,515,404 B1 2/2003 Wong
6,516,504 B2 2/2003 Schaper ..................... 29/25.42
6,559,420 B1 5/2003 Zarev ......................... 219/209
6,633,213 B1 10/2003 Dove .......................... 335/78
6,740,829 B1 * 5/2004 Wong ......................... 200/214
6,756,551 B2 * 6/2004 Wong ......................... 200/214
2002/0037128 A1 3/2002 Burger et al. ................. 385/16
2002/0146197 A1 10/2002 Yong ........................... 385/17
2002/0150323 A1 10/2002 Nishida et al. ............... 385/16
2002/0168133 A1 11/2002 Saito ........................... 385/16
2003/0035611 A1 2/2003 Shi ............................. 385/16

FOREIGN PATENT DOCUMENTS

FR 2667396 9/1990
GB 2052871 A 5/1980
GB 2381595 A 10/2002
GB 2381663 A 10/2002
GB 2388471 A 3/2003
JP SHO 36-18575 10/1961
JP SHO 47-21645 10/1972
JP 63-276838 5/1987
JP 01-294317 5/1988
JP 08-125487 A 5/1996
JP 9161640 6/1997
WO WO 99/46624 A1 9/1999

OTHER PUBLICATIONS

"Integral Power Resistors for Aluminum Substrate." IBM Technical Disclosure Bulletin, Jun. 1984, US, Jun. 1, 1984, p. 827, vol. 27, No. 1B, TDB–ACC–NO: NB8406827, Cross Reference: 0018–8689–27–1B–827.

Kim, Joonwon et al, "A Micromechanical Switch with Electrostatically Driven Liquid–Metal Droplet." Sensors and Actuators, A: Physical. v 9798, Apr. 1, 2002, 4 pages.

* cited by examiner

INSERTION-TYPE LIQUID METAL LATCHING RELAY ARRAY

CROSS REFERENCE TO RELATED APPLICATIONS

This application is related to the following co-pending U.S. patent applications, being identified by the below enumerated identifiers and arranged in alphanumerical order, which have the same ownership as the present application and to that extent are related to the present application and which are hereby incorporated by reference:

Application 10010448-1, titled "Piezoelectrically Actuated Liquid Metal Switch", filed May 2, 2002 and identified by Ser. No. 10/137,691;

Application 10010529-1, "Bending Mode Latching Relay", and having the same filing date as the present application;

Application 10010531-1, "High Frequency Bending Mode Latching Relay", and having the same filing date as the present application;

Application 10010570-1, titled "Piezo electrically Actuated Liquid Metal Switch", filed May 2, 2002 and identified by Ser. No. 10/142,076;

Application 10010571-1, "High-frequency, Liquid Metal, Latching Relay with Face Contact", and having the same filing date as the present application;

Application 10010572-1, "Liquid Metal, Latching Relay with Face Contact", and having the same filing date as the present application;

Application 10010573-1, "Insertion Type Liquid Metal Latching Relay", and having the same filing date as the present application;

Application 10010617-1, "High-frequency, Liquid Metal, Latching Relay Array", and having the same filing date as the present application;

Application 10010618-1, "Insertion Type Liquid Metal Latching Relay Array", and having the same filing date as the present application;

Application 10010634-1, "Liquid Metal Optical Relay", and having the same filing date as the present application;

Application 10010640-1, titled "A Longitudinal Piezoelectric Optical Latching Relay", filed Oct. 31, 2001 and identified by Ser. No. 09/999,590;

Application 10010643-1, "Shear Mode Liquid Metal Switch", and having the same filing date as the present application;

Application 10010644-1, "Bending Mode Liquid Metal Switch", and having the same filing date as the present application;

Application 10010656-1, titled "A Longitudinal Mode Optical Latching Relay", and having the same filing date as the present application;

Application 10010663-1, "Method and Structure for a Pusher-Mode Piezoelectrically Actuated Liquid Metal Switch", and having the same filing date as the present application;

Application 10010664-1, "Method and Structure for a Pusher-Mode Piezoelectrically Actuated Liquid Metal Optical Switch", and having the same filing date as the present application;

Application 10010790-1, titled "Switch and Production Thereof", filed Dec. 12, 2002 and identified by Ser. No. 10/317,597;

Application 10011055-1, "High Frequency Latching Relay with Bending Switch Bar", and having the same filing date as the present application;

Application 10011056-1, "Latching Relay with Switch Bar", and having the same filing date as the present application;

Application 10011064-1, "High Frequency Push-mode Latching Relay", and having the same filing date as the present application;

Application 10011065-1, "Push-mode Latching Relay", and having the same filing date as the present application;

Application 10011121-1, "Closed Loop Piezoelectric Pump", and having the same filing date as the present application;

Application 10011329-1, titled "Solid Slug Longitudinal Piezoelectric Latching Relay", filed May 2, 2002 and identified by Ser. No. 10/137,692;

Application 10011344-1, "Method and Structure for a Slug Pusher-Mode Piezoelectrically Actuated Liquid Metal Switch", and having the same filing date as the present application;

Application 10011345-1, "Method and Structure for a Slug Assisted Longitudinal Piezoelectrically Actuated Liquid Metal Optical Switch", and having the same filing date as the present application;

Application 10011397-1, "Method and Structure for a Slug Assisted Pusher-Mode Piezoelectrically Actuated Liquid Metal Optical Switch", and having the same filing date as the present application;

Application 10011398-1, "Polymeric Liquid Metal Switch", and having the same filing date as the present application;

Application 10011410-1, "Polymeric Liquid Metal Optical Switch", and having the same filing date as the present application;

Application 10011436-1, "Longitudinal Electromagnetic Latching Optical Relay", and having the same filing date as the present application;

Application 10011437-1, "Longitudinal Electromagnetic Latching Relay", and having the same filing date as the present application;

Application 10011458-1, "Damped Longitudinal Mode Optical Latching Relay", and having the same filing date as the present application;

Application 10011459-1, "Damped Longitudinal Mode Latching Relay", and having the same filing date as the present application;

Application 10020013-1, titled "Switch and Method for Producing the Same", filed Dec. 12, 2002 and identified by Ser. No. 10/317,963;

Application 10020027-1, titled "Piezoelectric Optical Relay", filed Mar. 28, 2002 and identified by Ser. No. 10/109,309;

Application 10020071-1, titled "Electrically Isolated Liquid Metal Micro-Switches for Integrally Shielded Microcircuits", filed Oct. 8, 2002 and identified by Ser. No. 10/266,872;

Application 10020073-1, titled "Piezoelectric Optical Demultiplexing Switch", filed Apr. 10, 2002 and identified by Ser. No. 10/119,503;

Application 10020162-1, titled "Volume Adjustment Apparatus and Method for Use", filed Dec. 12, 2002 and identified by Ser. No. 10/317,293;

Application 10020241-1, "Method and Apparatus for Maintaining a Liquid Metal Switch in a Ready-to-Switch Condition", and having the same filing date as the present application;

Application 10020242-1, titled "A Longitudinal Mode Solid Slug Optical Latching Relay", and having the same filing date as the present application;

Application 10020473-1, titled "Reflecting Wedge Optical Wavelength Multiplexer/Demultiplexer", and having the same filing date as the present application;

Application 10020540-1, "Method and Structure for a Solid Slug Caterpillar Piezoelectric Relay", and having the same filing date as the present application;

Application 10020541-1, titled "Method and Structure for a Solid Slug Caterpillar Piezoelectric Optical Relay", and having the same filing date as the present application;

Application 10030438-1, "Inserting-finger Liquid Metal Relay", and having the same filing date as the present application;

Application 10030440-1, "Wetting Finger Liquid Metal Latching Relay", and having the same filing date as the present application;

Application 10030521-1, "Pressure Actuated Optical Latching Relay", and having the same filing date as the present application;

Application 10030522-1, "Pressure Actuated Solid Slug Optical Latching Relay", and having the same filing date as the present application; and Application 10030546-1, "Method and Structure for a Slug Caterpillar Piezoelectric Reflective Optical Relay", and having the same filing date as the present application.

FIELD OF THE INVENTION

The invention relates to the field of micro-electromechanical systems (MEMS) for electrical switching, and in particular to a high frequency piezoelectrically actuated latching relay array with liquid metal contacts.

BACKGROUND OF THE INVENTION

Liquid metals, such as mercury, have been used in electrical switches to provide an electrical path between two conductors. An example is a mercury thermostat switch, in which a bimetal strip coil reacts to temperature and alters the angle of an elongated cavity containing mercury. The mercury in the cavity forms a single droplet due to high surface tension. Gravity moves the mercury droplet to the end of the cavity containing electrical contacts or to the other end, depending upon the angle of the cavity. In a manual liquid metal switch, a permanent magnet is used to move a mercury droplet in a cavity.

Liquid metal is also used in relays. A liquid metal droplet can be moved by a variety of techniques, including electrostatic forces, variable geometry due to thermal expansion/contraction and magneto-hydrodynamic forces.

Conventional piezoelectric relays either do not latch or use residual charges in the piezoelectric material to latch or else activate a switch that contacts a latching mechanism.

Rapid switching of high currents is used in a large variety of devices, but provides a problem for solid-contact based relays because of arcing when current flow is disrupted. The arcing causes damage to the contacts and degrades their conductivity due to pitting of the electrode surfaces.

Micro-switches have been developed that use liquid metal as the switching element and the expansion of a gas when heated to move the liquid metal and actuate the switching function. Liquid metal has some advantages over other micro-machined technologies, such as the ability to switch relatively high powers (about 100 mW) using metal-to-metal contacts without micro-welding or overheating the switch mechanism. However, the use of heated gas has several disadvantages. It requires a relatively large amount of energy to change the state of the switch, and the heat generated by switching must be dissipated effectively if the switching duty cycle is high. In addition, the actuation rate is relatively slow, the maximum rate being limited to a few hundred Hertz.

SUMMARY

A high frequency electrical relay array is disclosed that uses a conducting liquid in the switching mechanism. Each relay element in the relay array uses an actuator, such as a piezoelectric element, to cause the switch actuator to insert into a cavity in a static switch contact structure. The cavity has sides and a pad on its end that are wettable by the conducting liquid. The cavity is filled with the conducting liquid, which may be liquid metal. Insertion of the switch actuator into the cavity causes the conducting liquid to be displaced outward and come in contact with the contact pad on the switch actuator. The volume of conducting liquid is chosen so that when the actuator returns to its rest position, the electrical contact is maintained by surface tension and by wetting of the contact pads on both the static switch contact structure and the actuator. When the switch actuator retracts away from the static switch contact structure, the available volume for conducting liquid inside the fixed switch contact structure increases and the combination of the movement of the conducting liquid into the cavity and the contact pad on the switch actuator moving away from the bulk of the conducting liquid causes the conducting liquid connection between the fixed and moving contact pads to be broken. When the switch actuator returns to its rest position, the contact remains electrically open because there is not enough conducting liquid to bridge the gap without being disturbed. The high frequency capability is provided by the additional conductors in the assembly, which act to make the switch a coaxial structure. The relay array is amenable to manufacture by micro-machining techniques.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

DETAILED DESCRIPTION

Figure 1:
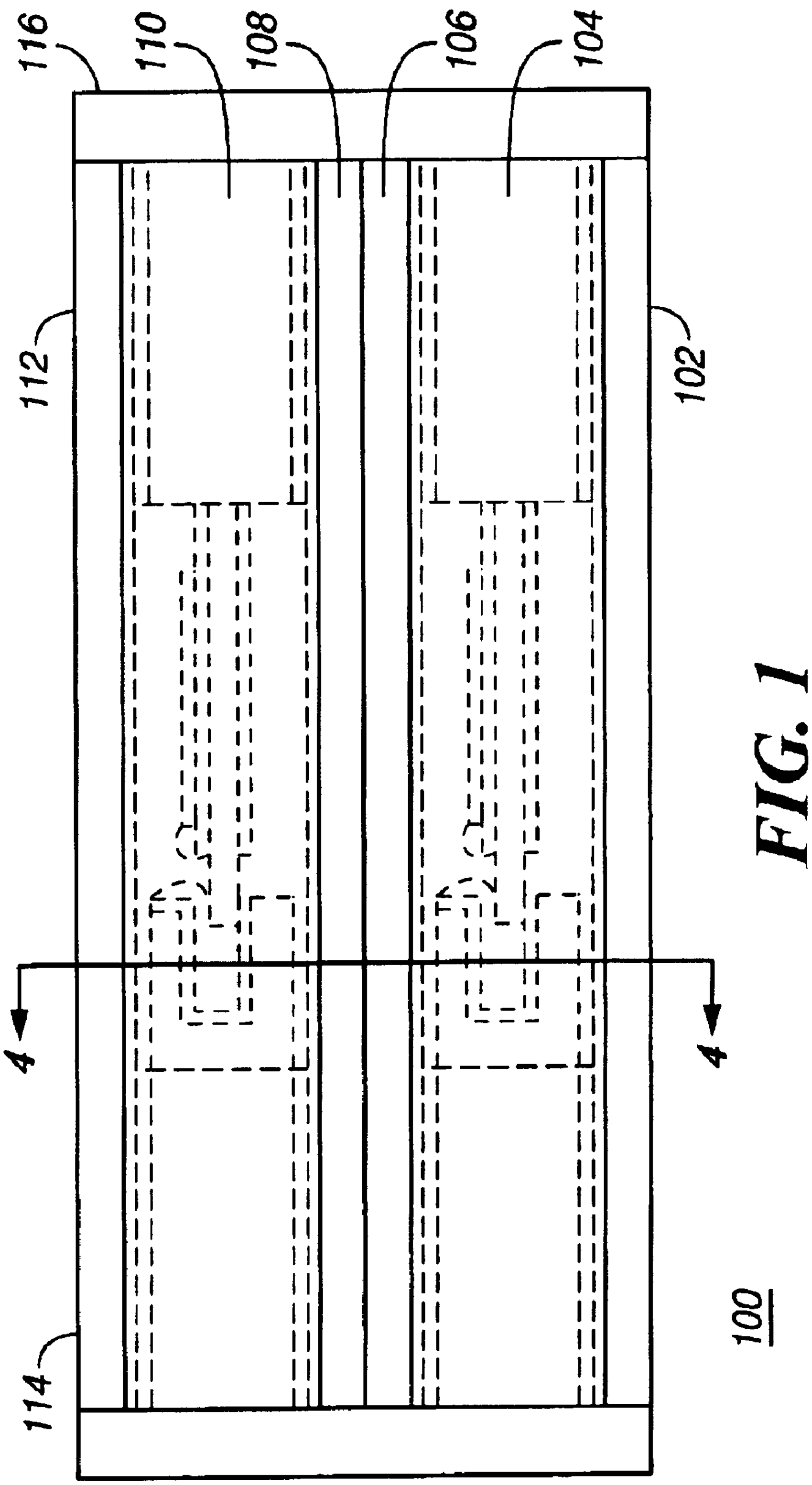
FIG. 1 is a view of an exemplary embodiment of a latching relay array consistent with certain embodiments of the present invention.

While this invention is susceptible of embodiment in many different forms, there is shown in the drawings and will herein be described in detail one or more specific embodiments, with the understanding that the present disclosure is to be considered as exemplary of the principles of the invention and not intended to limit the invention to the specific embodiments shown and described. In the description below, like reference numerals are used to describe the same, similar or corresponding parts in the several views of the drawings.

The relay array of the present invention incorporates a number of electrical switching elements or relays. Each relay uses a conducting liquid, such as liquid metal, to bridge the gap between two electrical contacts and thereby complete an electrical circuit between the contacts. Each relay uses an actuator, such as a piezoelectric element, to cause the switch actuator to insert into a cavity in a fixed switch contact structure. The cavity has sides and a pad on its end that are wettable by the conducting liquid. The cavity is filled with the conducting liquid. Insertion of the actuator into the cavity causes the conducting liquid to be displaced outward and come in contact with the contact pad on the actuator. The volume of conducting liquid is chosen so that when the actuator returns to its rest position, the electrical contact is maintained by surface tension and by wetting of the contact pads on both the static switch contact structure and the actuator. When the switch actuator retracts away from the static switch contact structure, the available volume for conducting liquid inside the fixed switch contact structure increases and the combination of the movement of the conducting liquid into the cavity and the contact pad on the switch actuator moving away from the bulk of the conducting liquid causes the conducting liquid connection between the fixed and moving contact pads to be broken. When the switch actuator returns to its rest position, the contact remains electrically open because there is not enough conducting liquid to bridge the gap without being disturbed. A high frequency capability is provided by the additional conductors in the assembly, which act to make the switch a coaxial structure.

In an exemplary embodiment, the conducting liquid is a liquid metal, such as mercury, with high conductivity, low volatility and high surface tension. The actuator is a piezoelectric actuator, but other actuators such as magnetostrictive actuators, may be used. In the sequel, piezoelectric actuators and magnetorestrictive actuators will be collectively referred to as "piezoelectic actuators".

In the exemplary embodiment, the array comprises one or more stacked levels, with each level containing one on more relays positioned side-by side. In this way, a rectangular grid of relays is formed. FIG. 1 is a view of an exemplary embodiment of a latching relay of the present invention. Referring to FIG. 1, the relay 100 comprises two levels. The lower level contains a lower cap layer 102, a switching layer 104 and an upper cap layer 106. The upper level has a similar structure and contains a lower cap layer 108, a switching layer 110 and an upper cap layer 112. The lower cap layers 102 and 108 support electrical connections to the elements in the switching layer and provide lower caps to the switching layer. The electrical connections are routed to end caps 114 and 116 that provide additional circuit routing and provide interconnections to the relay array. The circuit layers 102 and 108 may be made of a ceramic or silicon, for example, and are amenable to manufacture by micromachining techniques, such as those used in the manufacture of micro-electronic devices. The switching layers 104 and 110 may be made of ceramic or glass, for example, or may be made of metal coated with an insulating layer (such as a ceramic).

Figure 2:
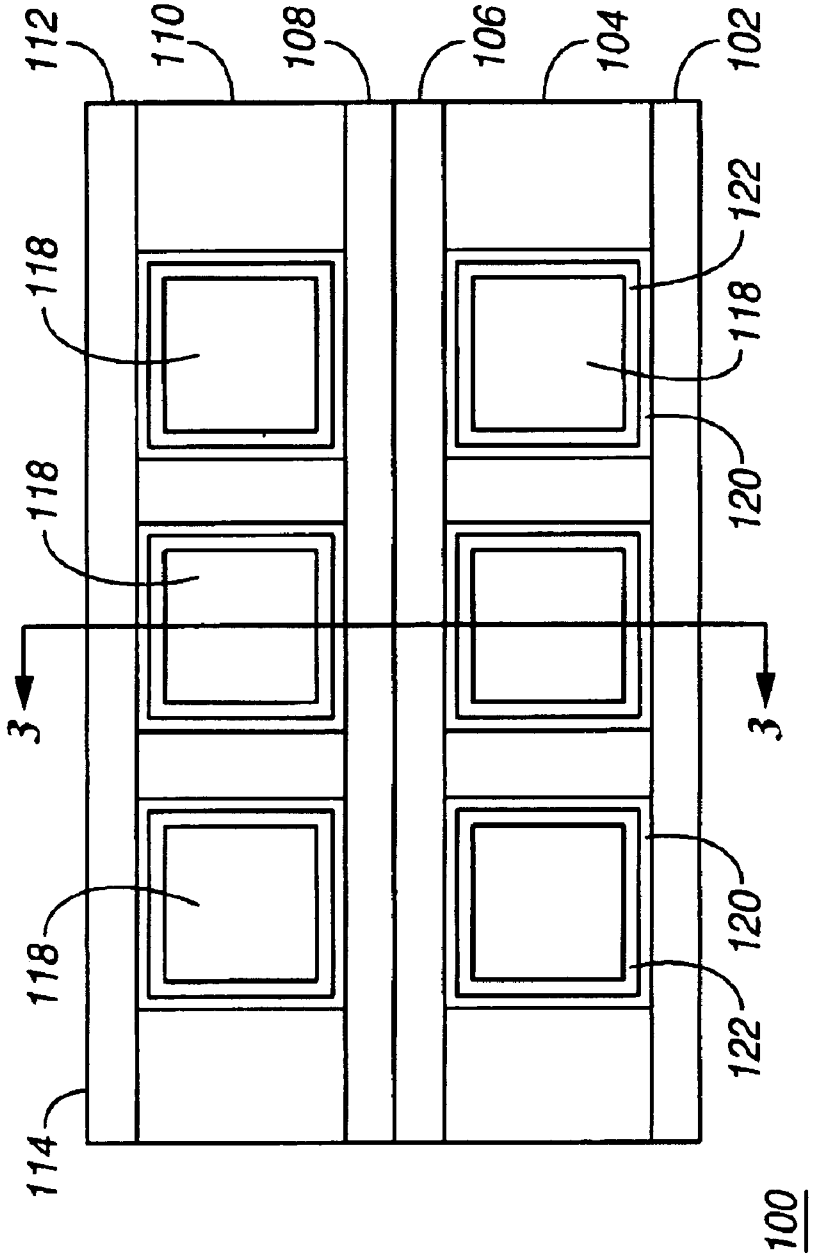
FIG. 2 is an end view of a latching relay array consistent with certain embodiments of the present invention.

FIG. 2 is an end view of the relay array shown in FIG. 1 with the end cap removed. Referring to FIG. 2, three channels pass through each of the switching layers 104 and 110. At one end of each channel is a signal conductor 118 that is electrically coupled to one of the switch contacts of the relay. Optionally, ground shields 120 may surround each of the switching channels. The ground shields are electrically insulated from the signal conductors 118 by dielectric layers 122. In the exemplary embodiment, the ground shields 120 are, in part, formed as traces deposited on the under side of the upper cap layers 106 and 112 and on the upper side of the lower cap layers 102 and 108. The upper cap layers 106 and 112 cover and seal the switching layers 104 and 110, respectively. The upper cap layers 106 and 112 may be made of ceramic, glass, metal or polymer, for example, or combinations of these materials. Glass, ceramic or metal may be used in the exemplary embodiment to provide a hermetic seal.

Figure 3:
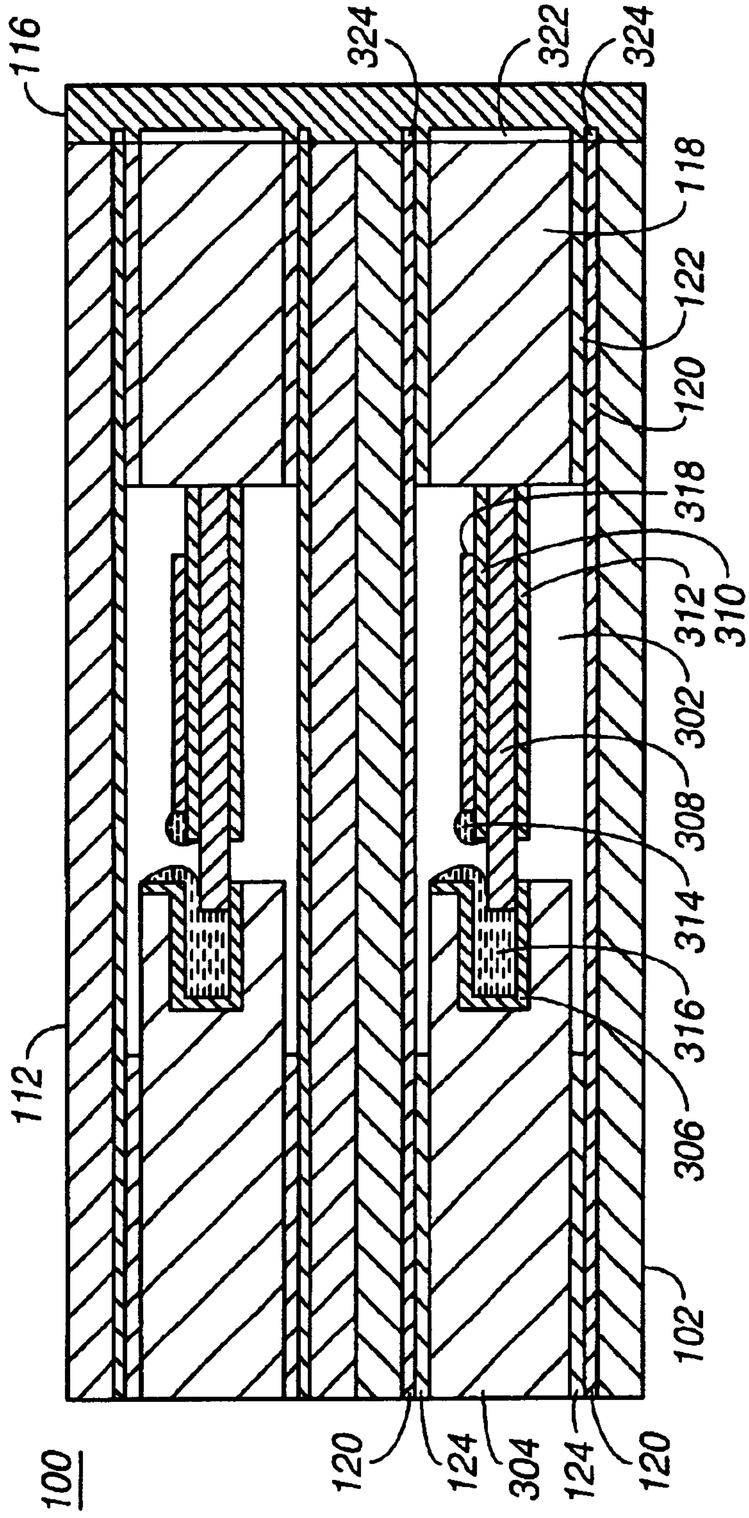
FIG. 3 is a sectional view of a latching relay array consistent with certain embodiments of the present invention.

FIG. 3 is a sectional view of an embodiment of a latching relay array 100 of the present invention. The section is denoted by 3—3 in FIG. 2. Referring to the lower level in FIG. 3, the switching layer incorporates a switching cavity 302. The cavity may be filled with an inert gas. A signal conductor 304 occupies one end the channel through the switching layer. The signal conductor 304 is electrically isolated from the ground conductor 120 by dielectric layer 124. A fixed electrical contact 306 is attached to the end of the signal conductor. Part of the fixed electrical contact 306 is concave and lines a cavity in the end of signal conductor 304. Another part forms a pad covering part of the interior end of the signal conductor 304. In a further embodiment, the liquid well is in close proximity to, but separate from the contact 306. The liquid well may be formed in structure other than the signal conductor 304. One end of actuator 308 is attached to the signal conductor 118, while the other end projects into the concave part of the fixed contact 306. A moveable electrical contact 310 is attached to the actuator. In operation, the length of the actuator 308 is increased or decreased to move the moveable electrical contact 310 towards or away from the fixed electrical contact 306. In an exemplary embodiment, the actuator includes a piezoelectric actuator. The moveable contact 310 may be formed as a conductive coating on the actuator 308, in which case contact 312 is a continuation of the contact 310. Alternatively, the contact 312 may be positioned on one side of the actuator and the contact 310 positioned on the other side to reduce bending of the actuator. In a further embodiment, the contact 312 is omitted. The surfaces of the static and moveable electrical contacts are wettable by a conducting liquid. In operation, the moveable contact 310 supports a droplet of conducting liquid 314 that is held in place by the surface tension of the liquid. Due to the small size of the droplet 314, the surface tension dominates any body forces on the droplets and so the droplet is held in place. The concave portion of the fixed contact 306 creates a liquid well that is filled with conducting liquid 316. The liquid 316 also wets the pad portion of the contact 306. The moveable contact 310 is partially coated with non-wetting coating 318 to prevent migration of the conducting liquid along the contact. Signal conductor 118 is electrically insulated from the ground conductor 120 by dielectric layer 122, while signal conductor 304 is electrically insulated from the ground conductor 120 by dielectric layer 124.

Also shown in FIG. 3 is the end cap 116. The end cap 116 supports circuitry 322 to enable connection to the signal conductor 118, and circuitry 324 to connect to the ground shield 120. These circuits are led to the edges or the outer surface of the end cap to allow external connection to the relay. Similar circuitry is provided to allow connection to each of the relays in the relay array.

Figure 4:
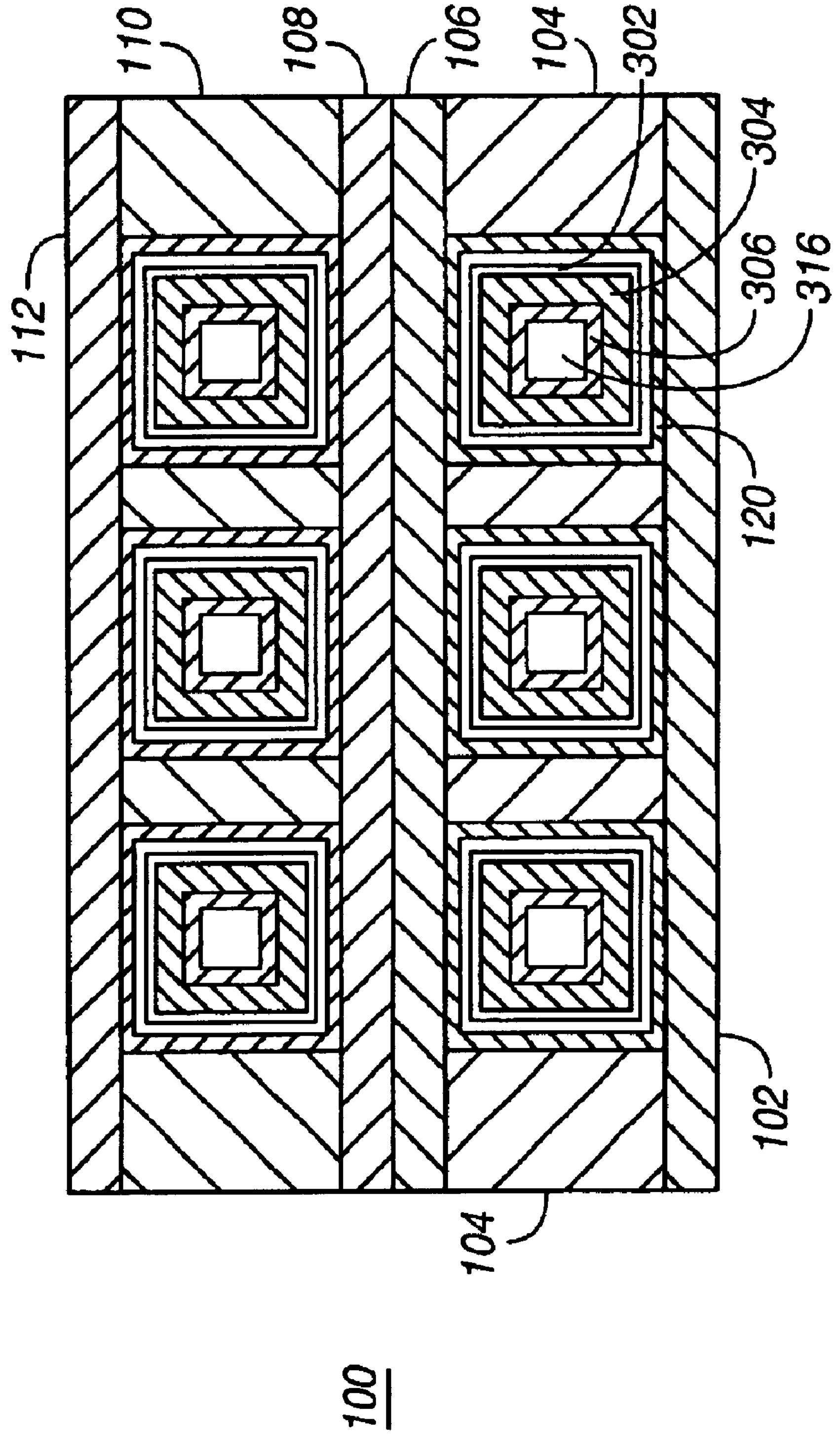
FIG. 4 is a further sectional view of a latching relay array consistent with certain embodiments of the present invention.

FIG. 4 is a sectional view through section 4—4 of the latching relay shown in FIG. 1. Referring to FIG. 4, the static contact 306 lines the inside of a cavity in the signal conductor 304 and forms a liquid well. Conducting liquid 316 is contained within the liquid well and is held in place by surface tension. The ground conductor 120 surrounds the signal conductor 304 and static contact 306. This facilitates high frequency switching of the relay.

Figure 5:
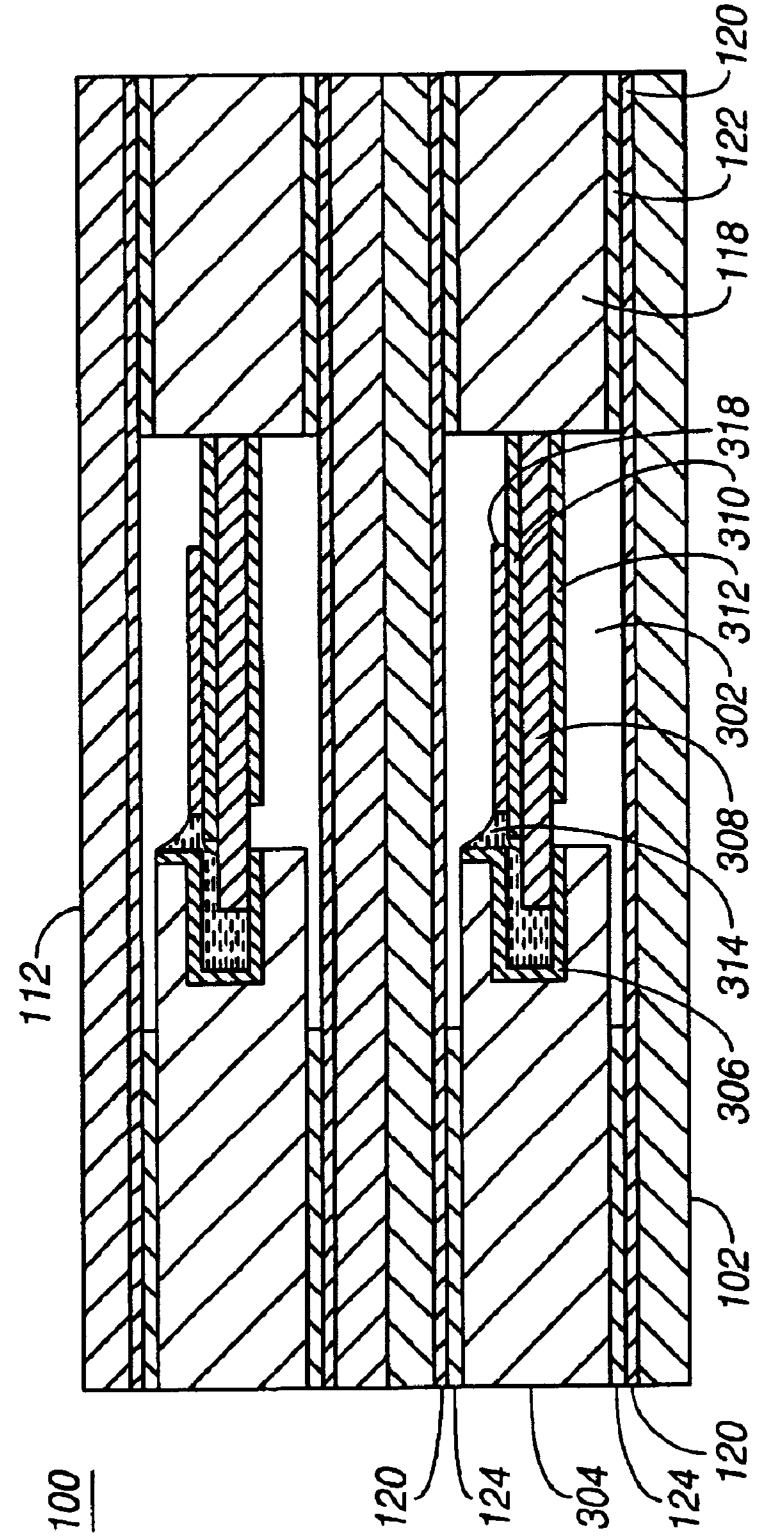
FIG. 5 is a sectional view of a latching relay array in a closed switch state consistent with certain embodiments of the present invention.

The electrical circuit through the relay is completed by energizing the actuator to cause it to extend into the well of conducting fluid as shown in the sectional view in FIG. 5. Referring to FIG. 5, the actuator 308 extends into the liquid well of conducting liquid contained in the concave part of the static contact 306. At the same time, the moveable contact 310 is brought closer to the static contact. The insertion of the actuator into the well forces some of the conducting liquid out of the well and causes it to bridge the gap between the static contact 306 and the moveable contact 310. This forms a single volume of conducting liquid 314. The conducting liquid 314 completes the electrical circuit between the signal conductors 118 and 304.

Figure 6:
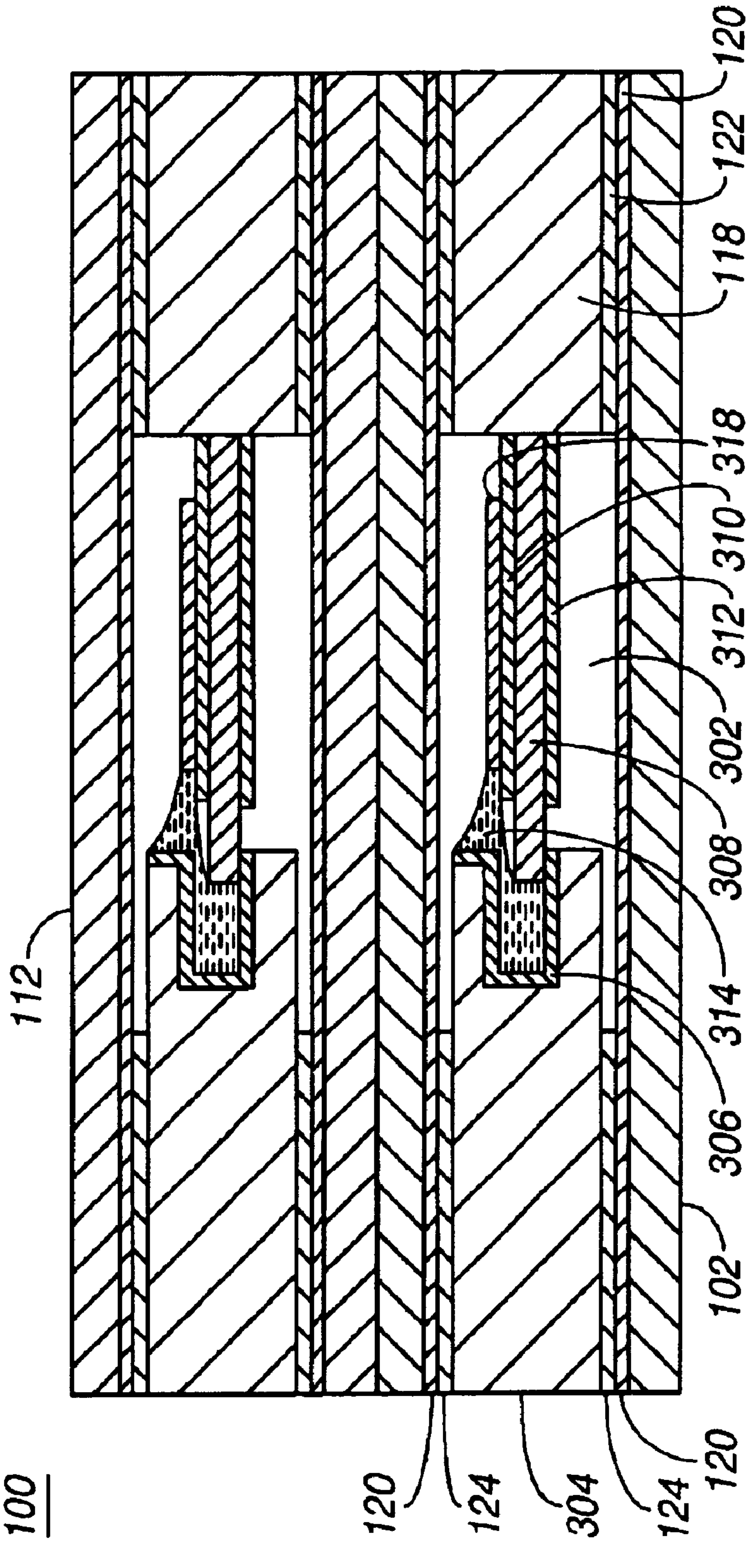
FIG. 6 is a further view of a switching layer of a latching relay array in a closed switch state consistent with certain embodiments of the present invention.

Once the circuit is complete, the actuator 306 is de-energized and withdraws from the liquid well. The volume of the conducting liquid and the spacing between the contacts are such that the conducting liquid continues to bridge the gap between the contacts as shown in FIG. 6. The electrical circuit between the contacts remains complete, so the relay is latched.

To break the electrical circuit between the contacts, the actuator is energized in the reverse direction so that its length decreases. The actuator withdraws from the liquid well and the moveable contact is moved farther away from the static contact. Conducting liquid is drawn back into the well. The surface tension bond is insufficient to hold the conducting liquid in a single volume, so the liquid separates into two volumes. In the manner, the electrical circuit is broken. When the actuator is again de-energized, there is insufficient liquid to bridge the gap, so the circuit remains open as shown in FIG. 3.

In a further embodiment, both electrical contacts are fixed and the actuator operates to displace conducting liquid from a liquid well such that it bridges the gap between the electrical contacts.

Although an actuator operating in an extension mode has been described, other modes of operation that result in a change in the volume of the part of the actuator inserted into the cavity of the fixed contact may be used.

The use of mercury or other liquid metal with high surface tension to form a flexible, non-contacting electrical connection results in a relay with high current capacity that avoids pitting and oxide buildup caused by local heating. The ground conductor provides a shield surrounding the signal path, facilitating high frequency switching.

Figure 7:
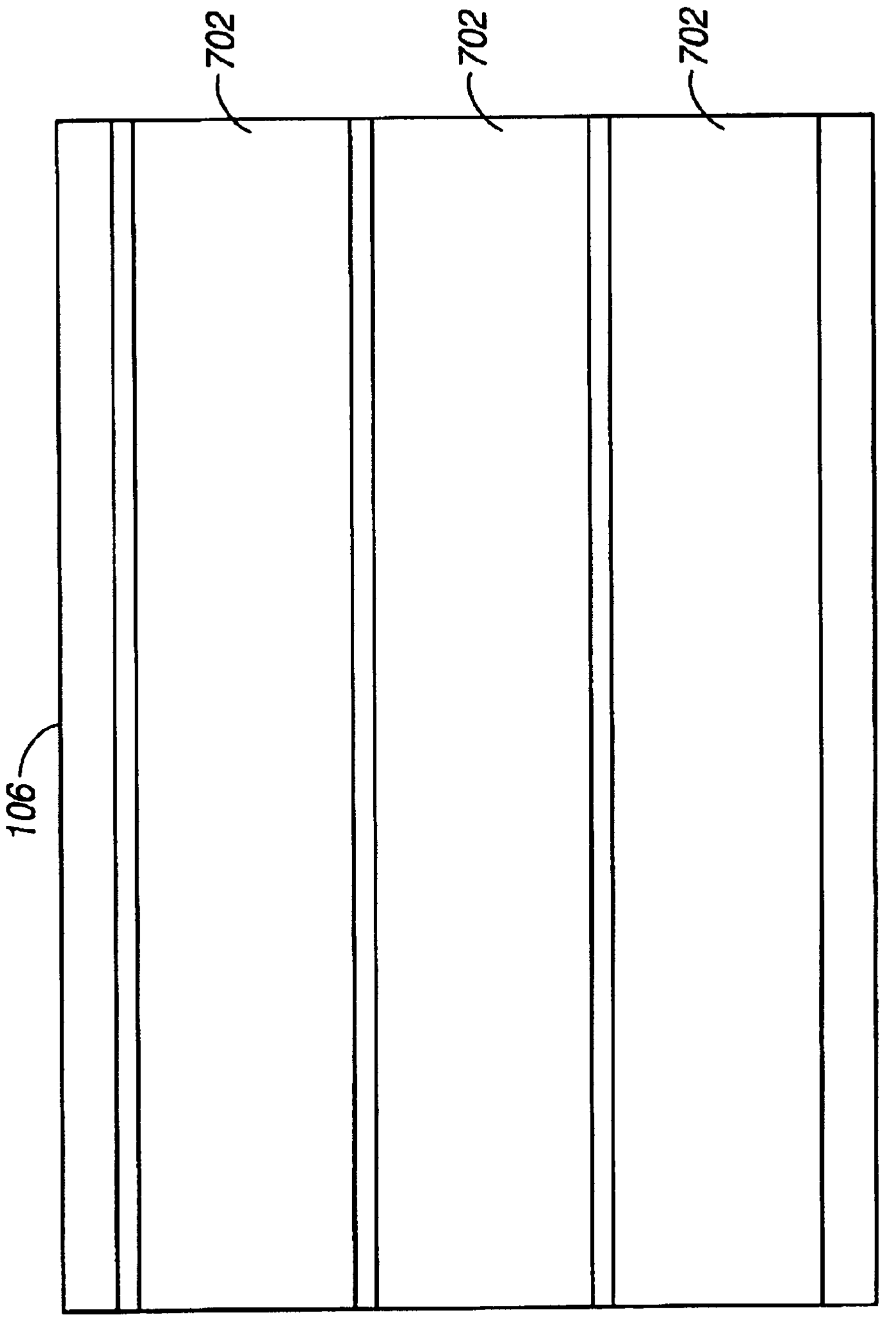
FIG. 7 is a view of a cap layer of a latching relay array consistent with certain embodiments of the present invention.

FIG. 7 is a view of the lower surface of the upper cap layer 106. The upper cap layer 106 provides a seal for the channel in the switching layer. Ground traces 702, one for each switching channel in the switching layer, are deposited on the surface of the upper cap layer, and form one side of the ground shields that are coaxial with the signal conductors and switching mechanisms. Similar ground traces are deposited on the upper surface of the lower cap layer.

Figure 8:
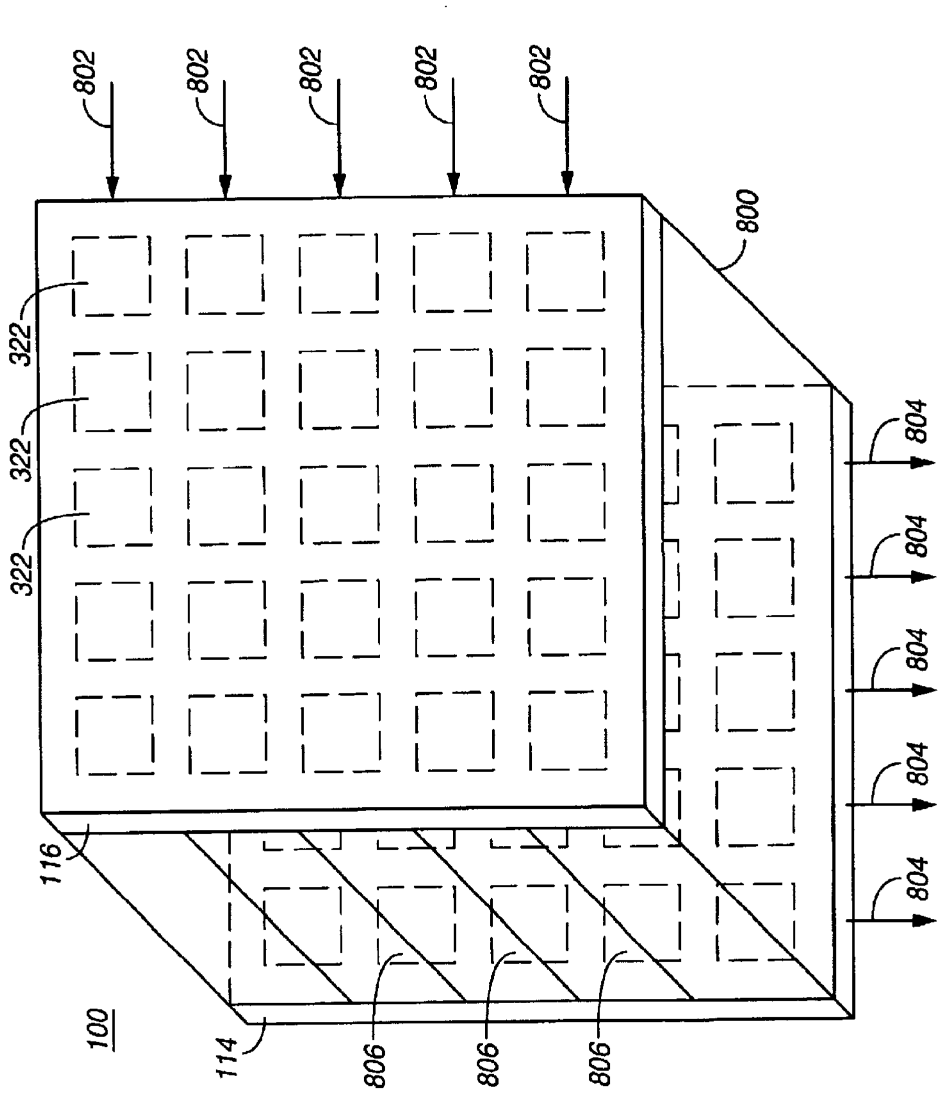
FIG. 8 is a view of a matrix multiplexer using a latching relay array consistent with certain embodiments of the present invention.

FIG. 8 is a view of a further embodiment of the present invention. Shown in FIG. 8 is a five-level relay array 100 with five switching elements per level. The details of levels of the array body 800 are omitted for clarity. The first end cap 114 supports circuitry 806 to enable connection to the first signal conductors (not shown). The second end cap 116 supports circuitry 322 to enable connection to the second signal conductors. Additional circuitry (not shown) allows connections of input signals 802 to the connection circuitry 322 and for connection of the circuitry 806 to the outputs 804. In this embodiment, one input signal is provided for each level (row) of the array and one output signal is provided for each column of the array. The elements of the array allow any input signal to be coupled to any output. The array functions as a matrix signal multiplexer.

In an exemplary embodiment, the static contact structure, the conductive coating on the actuator, and the signal conductors have similar outer dimensions for best electrical performance so as to minimize impedance mismatches.

While the invention has been described in conjunction with specific embodiments, it is evident that many alternatives, modifications, permutations and variations will become apparent to those of ordinary skill in the art in light of the foregoing description. Accordingly, the present invention is intended to embrace all such alternatives, modifications and variations as fall within the scope of the appended claims.

What is claimed is:

1. An electrical relay array comprising a plurality of switching elements, a switching of the plurality of switching elements comprising:

a first electrical contact, having a wettable surface;

a first conducting liquid volume in wetted contact with the first electrical contact;

a second electrical contact spaced from the first electrical contact and having a wettable surface;

a well-support structure in close proximity to the first and second electrical contacts, the well support structure having a liquid well formed within it;

a second conducting liquid volume in the liquid well in wetted contact with the second electrical contact; and an actuator having a rest position at least partially within the liquid well;

wherein expansion of the actuator decreases the volume of the liquid well and displaces the second liquid, thereby causing the first and second conducting liquid volumes to coalesce and complete an electrical circuit between the first and second electrical contacts, and contraction of the actuator increases the volume of the liquid well, thereby causing the first and second conducting liquid volumes to separate and break the electrical circuit.

2. An electrical relay array in accordance with claim 1, further comprising:

a first signal conductor, electrically coupled to the first electrical contact; and a second signal conductor, electrically coupled to the second electrical contact.

3. An electrical relay array in accordance with claim 2, wherein the second signal conductor provides the well-support structure.

4. An electrical relay in accordance with claim 2, further comprising:

a ground shield, encircling the first and second electrical contacts and the first and second signal conductors;

a first dielectric layer positioned between the ground shield and the first signal conductor, the first dielectric layer electrically insulating the ground shield from the first signal conductor; and a second dielectric layer positioned between the ground shield and the second signal conductor, the second dielectric layer electrically insulating the ground shield from the second signal conductor.

5. An electrical relay array in accordance with claim 1, wherein the first electrical contact is attached to the actuator.

6. An electrical relay array in accordance with claim 5, wherein expansion of the actuator moves the first electrical contact towards the second electrical contact and contraction of the actuator moves the first electrical contact away from the second electrical contact.

7. An electrical relay array in accordance with claim 1, wherein the actuator comprises one of a piezoelectric actuator and a magnetostrictive actuator.

8. An electrical relay array in accordance with claim 1, wherein the first and second conducting liquid volumes are liquid metal volumes.

9. An electrical relay array in accordance with claim 8, wherein the first and second conducting liquid volumes are mercury.

10. An electrical relay array in accordance with claim 1, wherein the first and second conducting liquid volumes are sized such that coalesced volumes remain coalesced when the actuator is returned to its rest position, and separated volumes remain separated when the actuator is returned to its rest position.

11. An electrical relay array in accordance with claim 1, further comprising a non-wetting coating partially covering the first electrical contact to prevent migration of the conducting liquid along the first electrical contact.

12. An electrical relay array in accordance with claim 1, further comprising:

a circuit substrate supporting electrical connections to the actuator;

a cap layer; and a switching layer positioned between the circuit substrate and the cap layer and having a channel formed therein;

wherein the first and second electrical contacts and the actuator are positioned within the channel.

13. An electrical relay array in accordance with claim 12, further comprising:

a first signal conductor, electrically coupled to the first electrical contact;

a second signal conductor, electrically coupled to the second electrical contact;

a first end cap supporting electrical connections to the first signal conductor of each relay element; and a second end cap supporting electrical connections to the second signal conductor of each relay element.

14. An electrical relay array in accordance with claim 13, wherein the electrical connections to the actuator comprise traces deposited on the surface of the lower cap layer and electrically coupled to connections on the one of the first end cap and the second end cap.

15. An electrical relay array in accordance with claim 13, wherein the electrical connections to the actuator comprise traces deposited on the surface of the circuit substrate.

16. An electrical relay array in accordance with claim 13, manufactured by a method of micro-machining.

17. An electrical relay array in accordance with claim 13, wherein the cap layer is fabricated from one of ceramic, glass, metal, silicon and polymer.

18. An electrical relay array in accordance with claim 13, wherein the circuit substrate is fabricated from one of ceramic, glass, silicon and polymer.

19. A method for completing an electrical circuit between a first contact and a second contact selected from a plurality of second contacts in a relay array, the first contact supporting a first conducting liquid droplet and each of the plurality of second contacts supporting a second conducting liquid droplet, the method comprising:

for each second contact of the plurality of second contacts that is not selected:

energizing an actuator to withdraw from a well of conducting liquid, thereby drawing conducting liquid into the well and causing the first and second conducting liquid droplets to separate and break the electrical circuit; and for the selected second contact:

energizing the actuator to insert into the well of conducting liquid, thereby displacing conducting liquid from the well and causing the first and second conducting liquid droplets to coalesce and complete the electrical circuit.

20. A method in accordance with claim 19, wherein the first contact is attached to the actuator.

21. A method in accordance with claim 20, wherein the first contact is moved towards the second contact when the actuator is inserted in the well and is moved away from the second contact when the actuator is withdrawn from the well.

22. A method in accordance with claim 19, further comprising:

for each second contact of the plurality of second contacts that is not selected:

de-energizing the actuator after the conducting liquid droplets separate; and for the selected second contact:

de-energizing the actuator after the conducting liquid droplets coalesce.

23. A method in accordance with claim 19, wherein the actuator is a piezoelectric actuator and wherein energizing the actuator comprises applying an electrical voltage across the piezoelectric actuator.

24. A method in accordance with claim 19, wherein the actuator is a magnetostrictive actuator and wherein energizing the actuator comprises applying an electrical voltage to generate an electromagnetic field across the magnetostrictive actuator.

* * * * *